(12) United States Patent
Kim et al.

(10) Patent No.: US 7,091,104 B2
(45) Date of Patent: Aug. 15, 2006

(54) SHALLOW TRENCH ISOLATION

(75) Inventors: Inki Kim, Seoul (KR); Sang Yeon Kim, Chungcheng-bukdo (KR); Min Paek, Chongju (KR); Ch'ng Toh Ghee, Penang (MY); Ramakrishnan Rajagopal, Navi Mumbai (IN); Chiew Gie Lee, Kuala Lumpur (MY); Wan Gie Lee, Namyangju-si (KR); Choong Shiau Chien, Penang (MY); Charlie Tay, Kedah (MY); Chang Gi Lee, Koyang (KR); Hitomi Watanabe, Tokyo (JP); Naoto Inoue, Chiba (JP)

(73) Assignee: SilTerra Malaysia Sdn. Bhd., Kedah (MY)

( * ) Notice: Subject to any disclaimer, the term of this patent is extended or adjusted under 35 U.S.C. 154(b) by 89 days.

(21) Appl. No.: 10/351,472

(22) Filed: Jan. 23, 2003

(65) Prior Publication Data
US 2004/0147090 A1  Jul. 29, 2004

(51) Int. Cl.
*H01L 21/76* (2006.01)
(52) U.S. Cl. .................. 438/424; 438/427; 438/435

(58) Field of Classification Search ......... 438/404–448
See application file for complete search history.

(56) References Cited

U.S. PATENT DOCUMENTS

| 5,994,229 | A  | * | 11/1999 | Chen et al. ............... 438/700 |
| 6,218,309 | B1 | * | 4/2001  | Miller et al. ............. 438/700 |
| 6,274,457 | B1 | * | 8/2001  | Sakai et al. .............. 438/424 |
| 2003/0067035 | A1 | * | 4/2003 | Tews et al. .............. 257/333 |
| 2004/0072451 | A1 | * | 4/2004 | Choi ..................... 438/791 |

* cited by examiner

*Primary Examiner*—H. Jey Tsai
(74) *Attorney, Agent, or Firm*—Townsend and Townsend and Crew LLP

(57) ABSTRACT

A method for forming an isolation structure on a semiconductor substrate includes opening a portion of a pad oxide layer overlying the substrate using a process gas including an etchant gas and a polymer-forming gas. A portion of the substrate exposed by the opening step is etched to form a trench having a first slope and a second slope. The first slope is greater than 45 degrees, and the second slope is less than 45 degrees. The trench is filled to form the isolation structure.

16 Claims, 3 Drawing Sheets

SHALLOW TRENCH ISOLATION

BACKGROUND OF THE INVENTION

The present invention relates to formation of shallow trench isolation in a semiconductor device.

Semiconductor chips manufactured these days generally include millions of transistors. Isolation structures are provided between active regions of a semiconductor device. Each active region has a plurality of transistors and the isolation structures prevent short circuit from occurring among transistors provided in different active regions. As device size gets smaller, isolation between active regions within a semiconductor chip becomes more and more critical. Field oxide isolation is one common solution. With field oxide isolation, regions of oxide material are thermally grown to define active areas on the semiconductor chip. This technique requires considerable surface area and therefore is not desirable for highly integrated devices.

Another known solution is deep trench isolation, a technique where relatively deep trenches are filled with dielectric material and positioned between active regions. Unfortunately, forming reliable deep trenches is complicated and challenging, especially as spacing between devices get smaller. In addition, acceptable isolation is often not possible unless the depth of the trench is larger than the well depth.

Another isolation solution is the shallow trench isolation (STI) method, where a STI structure is formed to electrically isolate the two more active regions within a chip. The use of STI structure is advantageous in that it occupies a smaller area than the field oxide isolation and is easier to make than the deep trench isolation. Nevertheless, there are some fabrication problems or concerns associated with the STI. One such a problem is that a groove may be formed around the STI, resulting in uneven profiles that may cause current problems. This groove problem is particularly problematic for devices requiring thick gate A oxides, e.g., devices having dual gate oxide layers. Another problem is that the thick gate oxide thickness on the STI corner is thinner than the plain region. This results in two problems: (1) the gate oxide quality degradation and (2) a leaky transistor, especially on NMOS. The electric field concentrates on a sharp corner region and causes the threshold voltage of the NMOS transistor to decrease partially in the STI corner region, which results in a sub-threshold leakage current, also referred to as a "double hump" problem.

BRIEF SUMMARY OF THE INVENTION

Embodiments of the present invention relates to a semiconductor device having a shallow trench isolation structure. In one embodiment, a method for forming a semiconductor device having a shallow trench isolation (STI) structure includes providing a first active region. A second active region is provided. A STI structure is formed to electrically isolate the first and second active regions. The STI structure has a body and a shoulder. The body defines a first slope that is greater than 45 degrees. The shoulder defines a second slope that is less than 45 degrees.

In one embodiment, a method for forming a shallow trench isolation (STI) structure in a semiconductor substrate includes forming a pad oxide layer on the substrate, the pad oxide layer having a thickness of 200 about angstroms or less. A nitride layer is formed on the pad oxide layer, the nitride layer having an excess thickness of about 150–250 angstroms. The nitride layer is opened to expose a portion of the pad oxide layer using an anisotropic etch method. The portion of the pad oxide layer is opened to expose a portion of the substrate whereon a trench is to be formed, the pad oxide opening step including forming a polymer residue adjacent to an edge of the opening of the pad oxide layer, the pad oxide opening step having an etch rate of less than 3 angstroms per second, the polymer residue having a length of about 600 angstroms. The exposed portion of the substrate is etched to form the trench having a first slope and a second slope that is different from the first slope, the trench having a depth of 3000 angstroms. The trench is filled to form an STI structure having a body and a shoulder. A thick gate oxide layer is formed over the substrate; and forming a thin gate oxide layer over the substrate.

In another embodiment, a method for forming a shallow trench isolation (STI) structure in a semiconductor substrate includes forming a pad oxide layer on the substrate; forming a nitride layer on the pad oxide layer; opening the nitride layer to expose a portion of the pad oxide layer using an anisotropic etch method; opening the portion of the pad oxide layer to expose a portion of the substrate whereon a trench is to be formed, the pad oxide opening step including forming a polymer residue adjacent to an edge of the opening of the pad oxide layer, the pad oxide opening step having an etch rate of less than 5 angstroms per second; etching the exposed portion of the substrate to form the trench having a first slope and a second slope that is different from the first slope; and filling the trench to form an STI structure having a body and a shoulder.

In yet another embodiment, a method for forming an isolation structure on a semiconductor substrate includes opening a portion of a pad oxide layer overlying the substrate using a process gas including an etchant gas and a polymer-forming gas. A portion of the substrate exposed by the opening step is etched to form a trench having a first slope and a second slope. The first slope is greater than 45 degrees, and the second slope is less than 45 degrees. The trench is filled to form the isolation structure.

These and other embodiments of the present invention, as well as its advantages and features, are described in more detail in conjunction with the text below and attached figures.

DETAILED DESCRIPTION OF THE INVENTION

The present embodiments relate to formation of a shallow trench isolation in a semiconductor device e.g., silicon. For illustrative purposes, the embodiments are described below in conjunction with the steps involved in forming a STI in connection with fabricating a semiconductor device with dual gate oxide layers. However, the present invention is not limited thereto.

Figure 1:
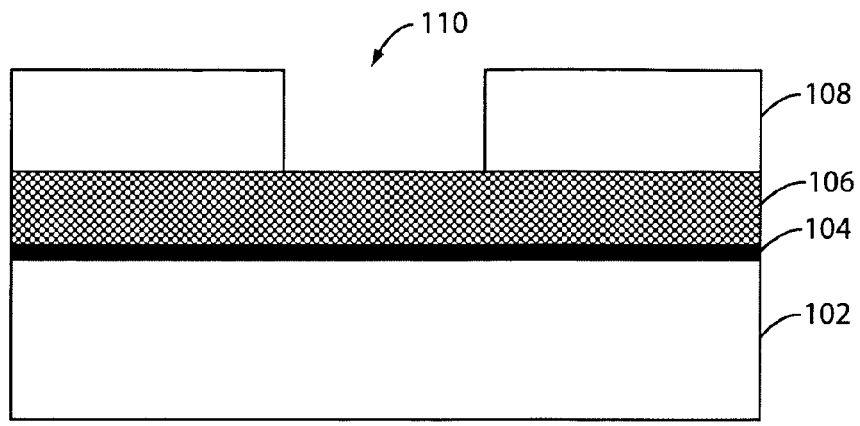
FIG. 1 shows a simplified cross-sectional view of a semiconductor substrate having a patterned photoresist layer.

FIG. 1 illustrates a silicon substrate 102 placed on a pedestal of a silicon etch chamber (not shown). The substrate has a pad oxide layer 104 provided thereon, a silicon nitride layer 106 provided over the pad oxide, and a patterned photoresist 108 provided over the nitride layer 106 by well-known techniques. The photoresist 108 has a pattern or opening 110 to define a portion of the substrate whereon shallow trench isolation ("STI") structure is to be formed.

In one embodiment, the pad oxide has a thickness of about 100–200 angstroms, and the nitride layer has a thickness of about 1200–1800 angstroms, which includes an excess thickness 107 of about 100–400 angstroms, preferably 200–300 angstroms, or more preferably 150–250 angstroms. The excess nitride thickness 107 is provided for use in a subsequent nitride pullback step, as will be explained later.

Figure 2:
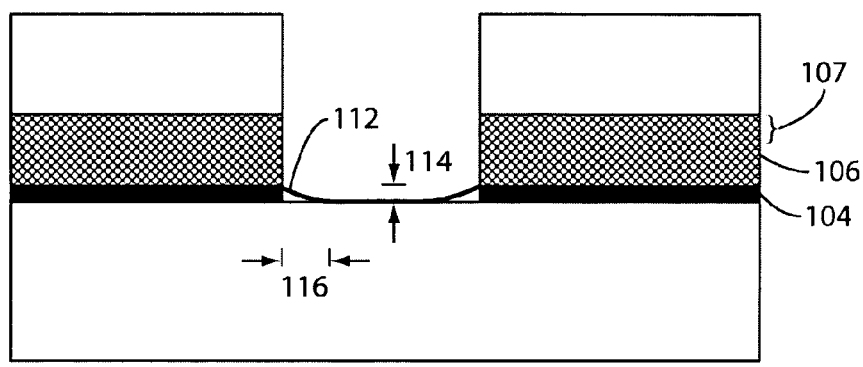
FIG. 2 shows a simplified cross-sectional view of the semiconductor substrate of FIG. 1 after nitride and oxide layers have been opened.

Referring to FIG. 2, the nitride layer 106 is opened to expose the pad oxide layer thereunder. Generally, anisotropic etch technique is used to remove selected portions of the nitride layer. The nitride-open step preferably should have an etch selectivity, where the nitride layer is removed at a faster rate than the photoresist. In one embodiment, the nitride open step is performed in a low pressure environment, e.g., less than 50 mT, applying a relatively high bias power for anisotropic etch profile, e.g., higher than 150 Watts, and a process gas including fluorine gas, e.g., $CF_4$, $SF_6$ or $CHF_3$, or a combination thereof. In one implementation, the following gas ratio is used, $CF_4$: $CHF_3$=1.5:1.

Thereafter, portions of the pad oxide 104 exposed by etching of the nitride layer are removed to expose the silicon substrate. The pad oxide etch or opening step also forms polymer residues 112 around the edges of the pad oxide 104. The pad oxide etch step is performed preferably in situ, i.e., the nitride and pad oxide layers are etched in the same chamber. In one embodiment, the pad oxide open step is also performed in a relatively high pressure environment, e.g., about 50 mT or higher, using a process gas including an etchant, e.g., $CF_4$, and polymer formation gas, e.g., $CHF_3$. The ratio of the etchant to the polymer formation gas is 1:4. The gas ratio may vary depending on the amount of polymer residue desired for a particular application. The gas flow rates for the $CF_4$ and $CHF_3$ are 22 sccm and 90 sccm, respectively. The flow rates also may be varied depending on the application. The source power is provided with about 600 W, and the bias power is provided with about 150 W.

The pad oxide is opened relatively slowly compared to conventional techniques in order to generate the polymer residue 112 of sufficient amount. For example, the etch rate of the pad oxide opening step is about 0.5–5 angstroms per second, preferably 3 angstroms per second or less, or more preferably 1–2 angstroms per second. In the present embodiment, the pad oxide opening step is conducted for about 120 seconds to open the pad oxide 104 having a thickness of about 100–200 angstroms. In one embodiment, the polymer residue 112 formed according to the above process has a length 116 of about 650 angstroms for growing 700 angstroms of oxide to form final 500 angstroms of thick gate oxide.

In contrast, conventional pad oxide opening steps generally are performed for about 15 seconds to open a pad oxide of similar thickness, i.e., an etch rate of about 10 angstroms per second or more. The conventional pad oxide opening techniques are provided with high etch ratio to increase throughput. Accordingly, the conventional process gas generally comprises only etchant gas, or etchant and inert gases. The conventional process gas does not include a polymer forming gas, as in the present embodiment, since it is conventional wisdom that the polymer residue formation is undesirable when performing a pad oxide opening.

Figure 3:
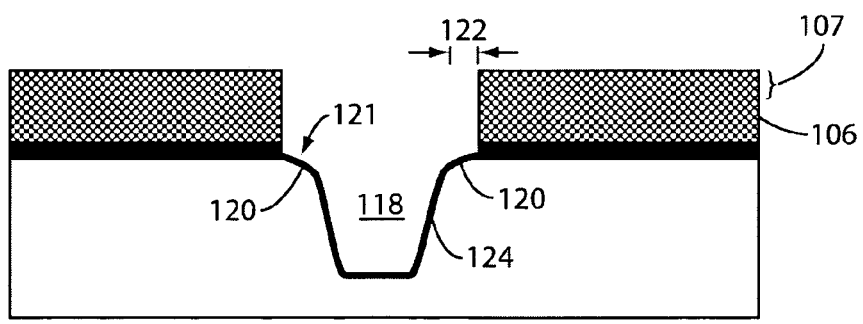
FIG. 3 shows a simplified cross-sectional view of the semiconductor substrate of FIG. 2 after a trench has been formed.

Referring to FIG. 3, after opening the nitride and pad oxide layers, silicon substrate 102 is etched in-situ to form a trench 118 using an anisotropic etch technique that provides a relatively low etch rate, e.g., about 3000 angstroms per 80–90 seconds. The silicon etch step is provided with a lower etch rate, so that the polymer residue 112 is not attacked too aggressively. The polymer residue 112 is needed to form an inner shoulder 120 around the trench opening. Accordingly, relatively low bias power is used as well to prevent the polymer residue from being broken apart too quickly. A length 122 of the inner shoulder 120 generally corresponds to the length 116 of the polymer residue 112. The length 122 is about 550–650 angstroms. The inner shoulder 120 has an angle 121 with respect to a main surface of the substrate 102. The angle 121 is less than 45 degrees, preferably about 20 degrees. The trench is also provided with a slope 124 of about 70–80 degrees, which is less angular than conventional trenches, which has 80 degrees or more.

In one embodiment, the silicon etch process gas includes $Cl_2$, HBr, and $O_2$. In one implementation, the silicon or trench etch step uses the following parameters: 12 mTorr of pressure, 250 watts of source power, 100 watts of bias power, 12 sccm of $O_2$, 15 sccm $Cl_2$ and 250 sccm of HBr. In other implementations, different process parameter values may be used. For example, the pressure may be in the range of 5 mTorr to 30 mTorr; the source power may be 200 watts to 300 watts; the bias power may be 50 watts to 150 watts; the oxygen flow may be 5–20 sccm. The $Cl_2$ and HBr gas ratio may be in the range of 1:10 to 1:20, preferably 1:15, to ensure that proper polymerization results. The high ratio of the polymer forming HBr with respect to the echtant $Cl_2$ enables the trench etch to be conducted without too aggressively destroying the polymers generated during the pad oxide etch. In addition, the high source power (top power) generates polymer that protects the sidewalls of the trench, thereby protecting the trench profile. The trench angle profile can vary with varying the flow of $O_2$. The polymer deposited at prior steps, e.g., the pad oxide etch step, also protects the trench sidewalls. If insufficient polymer had been deposited during the pad oxide etch step, then sidewall etching may occur, especially at the bottom of the trench.

In one embodiment, a pre-etch chamber conditioning is performed prior to processing a first wafer, e.g., for about 15–45 minutes, preferably about 30 minutes. Thereafter, a wafer auto clean is performed for about 30 seconds to 3minutes, preferably about 1 minute, after each wafer process to control polymer formation control and obtain better repeatability. Without pre-etch WAC, the polymerization increases from first wafer to the $5^{th}$ wafer.

After the trench etch, the remaining photoresist layer is stripped using a plasma ignited from oxygen gas. Alternatively, the photoresist may be stripped in a special resist-stripping chamber (downstream chamber) by exposing the photoresist mostly to reactive radicals rather than exposing it directly to plasma.

Figure 4:
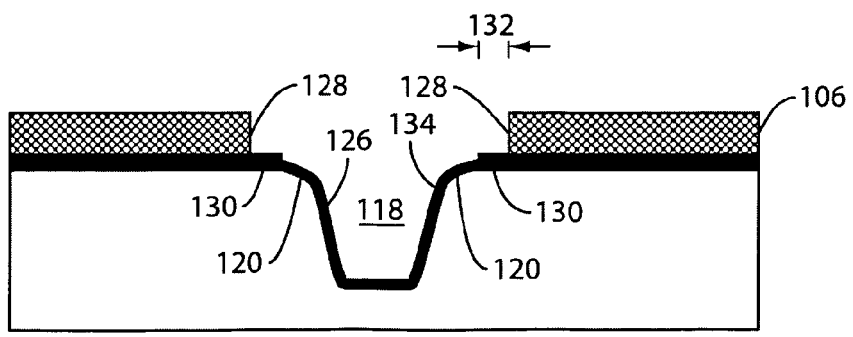
FIG. 4 shows a simplified cross-sectional view of the semiconductor substrate of FIG. 3 after a nitride pullback step has been performed.

Referring to FIG. 4, a first liner oxide 126 is formed over the exposed silicon substrate including the trench to protect the silicon substrate from the subsequent nitride pullback step. The first liner oxidation 126 has a thickness of 200 angstroms in one embodiment. A nitride pullback step involves an isotropic etch step using $H_3PO_4$ in on embodiment. The nitride pullback step removes the excess thickness 107 and causes edges 128 of the nitride layer 106 to recede from the trench opening (or edges of the pad oxide opening), thereby forming an outer shoulder 130. A length 132 of the outer shoulder 130 generally corresponds to the thickness of the excess thickness 107, e.g., about 200 angstroms, of the nitride layer 106 since the nitride pullback step involves an isotropic etch method.

In one embodiment, the amount of nitride pullback (outer shoulder length), the length of the inner shoulder, the thickness of the thick gate oxide, and the amount of the oxide loss in subsequent wet cleaning steps may be used to an STI of a given characteristic that can reduce the sub-threshold leakage for improved transistor characteristics.

After the nitride pullback, the surfaces of the first liner oxide 126 and the nitride layer 106 are cleaned to remove any contaminants resulting from the nitride pullback step. In one embodiment, this cleaning step involves dipping the substrate into a cleaning solvent, e.g., diluted HF. Since this cleaning step also removes portions of the first liner oxide 126, a second linear oxide 134 is formed over the trench 118 and the inner and outer shoulders 120 and 130.

Figure 5:
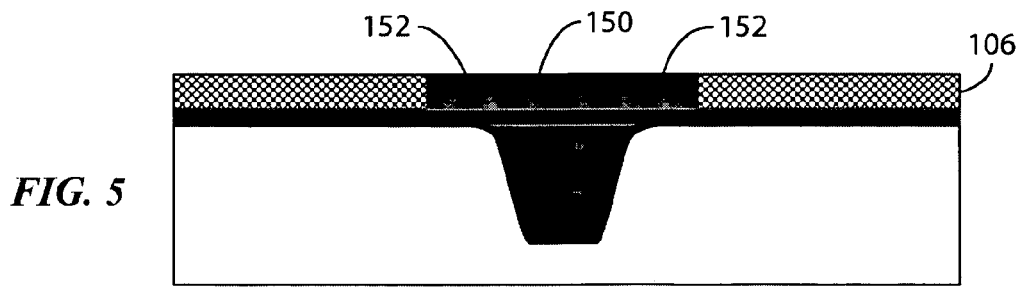
FIG. 5 shows a simplified cross-sectional view of the semiconductor substrate of FIG. 4 the trench has been filled with a plug.

Referring to FIG. 5, a chemical vapor deposition (CVD), e.g., high-density plasma (HDP) CVD, is performed to deposit oxide into the trench to form a plug 150 having a body and an extension or plug shoulder 152. The body defines the main trench. The plug shoulder 152 extends outward from the edges of the trench (or body) and lies over the inner and outer shoulders 120 and 130 of the trench. A chemical mechanical polishing is performed to flatten the surfaces of the nitride layer 106 and the plug 150.

Figure 6:
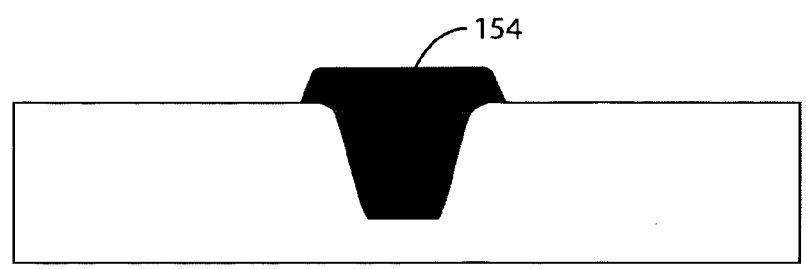
FIG. 6 shows a simplified a cross-sectional view of the semiconductor substrate of FIG. 5 after the nitride layer has been stripped.

The nitride layer 106 is stripped using a well-known technique (FIG. 6). The pad oxide 104 exposed by the nitride stripping is then removed. As a result, a plug 154 is obtained. In one embodiment, the wells and channels are formed thereafter at this stage of the process.

Figure 7:
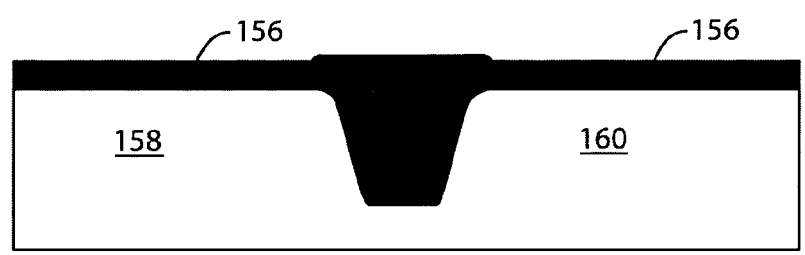
FIG. 7 shows a simplified cross-sectional view of the semiconductor substrate of FIG. 6 after a thick gate oxide layer has been formed.

A pre-thick gate oxidation cleaning step is performed (FIG. 7). A thick oxide layer 156 is deposited or grown over the silicon substrate to form a thick gate oxide. In one embodiment, the gate oxide is grown to obtain a better quality oxide. The thick gate oxide has a thickness of about 700 angstroms. The thick oxide layer 156 is formed over both a high voltage area 158 and a low voltage area 160.

Figure 8:
FIG. 8 shows a simplified cross-sectional view of the semiconductor substrate of FIG. 7 after a portion of the thick gate oxide overlying a low voltage region is removed.
Figure 9:
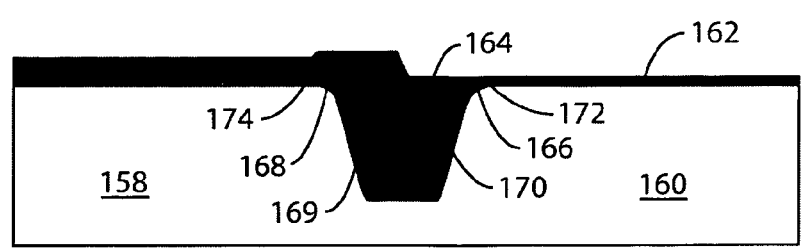
FIG. 9 shows a simplified cross-sectional view of the semiconductor substrate of FIG. 8 after a thin gate oxide layer is formed over the low voltage region.

The thick oxide 156 overlying the low voltage area 160 is removed using a well-known photolithography technique since the low voltage area 160 requires a thin gate oxide to accommodate low voltage operations (FIG. 8). A thin gate oxide layer 162 is formed, e.g., grown, over the low voltage area 160 (FIG. 9). A resulting plug or STI structure 164 includes a body 169 and first and second STI shoulders 166 and 168, where the first STI shoulder 166 is adjacent to the low voltage area 160, and the second STI shoulder 168 is adjacent to the high voltage area 158. The shoulders 166 and 168 each has a length of about 450–650 angstrom depending upon the pattern density. The STI structure 164 defines at least two slopes, a first slope 170 (defined by the body 169) corresponding to the trench slope 124 in FIG. 3 and a second slope 172 corresponding to the angle 121 of the inner shoulder 120 in FIG. 3. The first slope 170 is greater than 45 degrees, e.g., 70–80 degrees, and the second slope 172 is less than 45 degrees, e.g., 20 degrees. The STI structure 164 may also include a third slope 174 corresponding to the outer shoulder 130 formed by the nitride pullback step.

Figure 10:
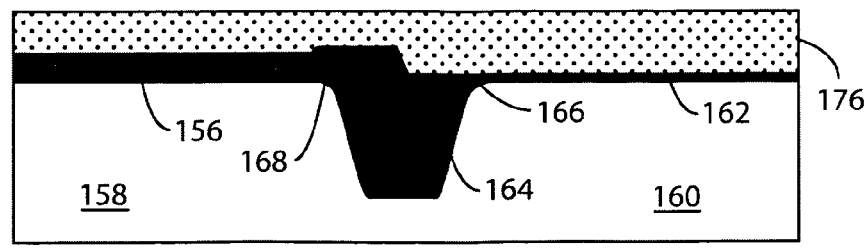
FIG. 10 shows a simplified cross-sectional view of the semiconductor substrate of FIG. 9 after a polysilicon layer has been deposited.
Figure 11:
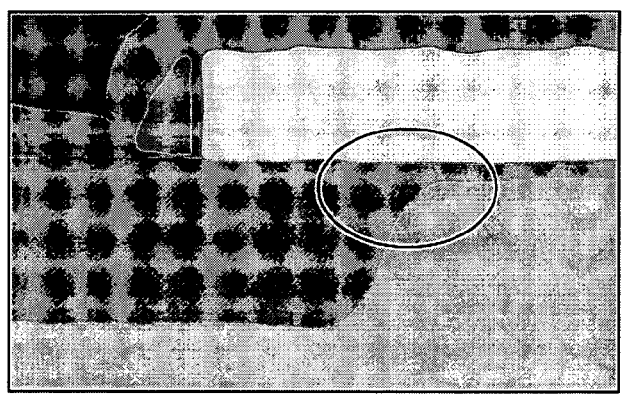
FIG. 11 an SEM photograph of a shallow trench isolation structure formed according to the present embodiment.

Thereafter, a polysilicon layer 176 is formed over the thick gate oxide 156, the STI structure 164, and the thin gate oxide 162 (FIG. 10) to form the gate structure. The STI structure 164 of FIG. 10 is free of grooves around the trench opening, which causes current leakage problems. Accordingly, the STI structure 164 provides good electrical isolation between active regions within the device. FIG. 11 shows a photograph of a STI structure formed according to present embodiment. The STI structure is free of grooves and free from hump phenomenon around the trench opening.

The above detailed descriptions are provided to illustrate specific embodiments of the present invention and are not intended to be limiting. Numerous modifications and variations within the scope of the present invention are possible. Accordingly, the present invention is defined by the appended claims.

What is claimed is:

1. A method for forming an isolation structure on a semiconductor substrate, the method comprising:
   forming a pad oxide layer over the substrate;
   forming a nitride layer over the pad oxide;
   opening a portion of the nitride layer, the nitride layer opening defining a first edge;
   opening a portion of a pad oxide layer exposed by the nitride opening step using a process gas including an etchant gas and a polymer-forming gas to form a polymer residue at a second edge of the opened portion of the pad oxide, the second edge of the pad oxide layer being substantially aligned to the first edge of the nitride layer;
   etching a portion of the substrate exposed by the opening step to form a trench having a first slope and a second slope, the first slope being greater than 45 degrees and the second slope being less than 45 degrees;
   forming a first liner oxide layer over the trench prior to the isotropic etching of the nitride layer to protect the substrate from being damaged during a subsequent etch step;
   etching the nitride layer using an isotropic etch to cause the first edge of the nitride layer to recede outwardly from the trench, the first liner oxide protecting the substrate during the isotropic nitride etch; and
   filling the trench to form the isolation structure.

2. The method of claim 1, wherein the isolation structure is a shallow trench isolation (STI) structure.

3. The method of claim 1, wherein the pad oxide opening step has an etch rate of less than 3 angstroms per second.

4. The method of claim 1, wherein the pad oxide has a thickness of less than 200 angstroms and the pad oxide opening step is performed in an environment having pressure of 50 mT or greater.

5. The method of claim 4, wherein the etchant gas is CF4 and the polymer forming gas is CHF3.

6. The method of claim 1, wherein the nitride layer formed over the pad oxide is provided with an excess thickness of at least 150 angstroms that is to be removed during the subsequent isotropic nitride etching step.

7. The method of claim 1, further comprising:
forming a second liner oxide layer over the trench after performing the isotropic nitride etching.

8. The method of claim 7, further comprising:
forming a thick gate oxide layer over the substrate; and
forming a thin gate oxide layer over the substrate.

9. The method of claim 7, wherein the isolation structure is a shallow trench isolation structure having a body and a shoulder, wherein the body defines the first slope greater than 45 degrees and the shoulder defines the second slope less than 45 degrees.

10. The method of claim 1, wherein the isolation structure is a shallow trench isolation structure having a body and a shoulder, wherein the body defines the first slope greater than 45 degrees and the shoulder defines the second slope less than 45 degrees.

11. A method for forming a shallow trench isolation (STI) structure in a semiconductor substrate, the method comprising:
forming a pad oxide layer over the substrate;
forming a nitride layer over the pad oxide layer, the nitride layer being provided with an excess thickness;
opening the nitride layer to expose a portion of the pad oxide layer using an anisotropic etch method;
opening the portion of the pad oxide layer to expose a portion of the substrate whereon a trench is to be formed, the pad oxide opening step including forming a polymer residue adjacent to an edge of the opening of the pad oxide layer, the pad oxide opening step having an etch rate of less than 5 angstroms per second;
etching the exposed portion of the substrate to form the trench having a first slope and a second slope that is different from the first slope;
forming a first liner oxide layer over the trench;
performing a nitride pullback step using an isotropic etch method to remove the excess thickness and cause an edge of the nitride layer to recede from an edge of the pad oxide layer, the first liner oxide layer protecting the substrate during the nitride pullback step;
forming a second liner oxide layer over the trench after performing the nitride pullback step; and
filling the trench to form an STI structure having a body and a shoulder.

12. The method of claim 11, wherein the first slope defines the body of the STI structure and the second slope defines the shoulder of the STI structure, and the pad oxide etch rate is less than 3 angstroms per second.

13. The method of claim 11, wherein the first slope is greater than 45 degrees, and the second slope is less than 45 degrees.

14. The method of claim 13, wherein the first slope is about 70 degrees to about 80 degrees.

15. The method of claim 11, wherein the pad oxide has a thickness of less than 200 angstroms and the pad oxide opening step is performed in an environment having pressure of 50 mT or greater.

16. A method for forming a shallow trench isolation (STI) structure in a semiconductor substrate, the method comprising:
forming a pad oxide layer on the substrate, the pad oxide layer having a thickness of 200 about angstroms or less;
forming a nitride layer on the pad oxide layer, the nitride layer having an excess thickness of about 150–250 angstroms;
opening the nitride layer to expose a portion of the pad oxide layer using an anisotropic etch method;
opening the portion of the pad oxide layer to expose a portion of the substrate whereon a trench is to be formed, the pad oxide opening step including forming a polymer residue adjacent to an edge of the opening of the pad oxide layer, the pad oxide opening step having an etch rate of less than 3 angstroms per second, the polymer residue having a length of about 600 angstroms;
etching the exposed portion of the substrate to form the trench having a first slope and a second slope that is different from the first slope, the trench having a depth of 3000 angstroms;
forming a first liner oxide layer over the trench;
performing a nitride pullback step using an isotropic etch method to remove the excess thickness and cause an edge of the nitride layer to recede from an edge of the pad oxide layer, the first liner oxide protecting the substrate from the nitride pullback step; and
forming a second liner oxide layer over the trench after the nitride pullback step;
filling the trench to form an STI structure having a body and a shoulder;
forming a thick gate oxide layer over the substrate; and
forming a thin gate oxide layer over the substrate.

* * * * *